(12) United States Patent
Wang et al.

(10) Patent No.: US 12,164,199 B2
(45) Date of Patent: Dec. 10, 2024

(54) DISPLAY SUBSTRATES, DISPLAY PANELS AND METHODS OF MANUFACTURING DISPLAY SUBSTRATE

(71) Applicants: Hefei BOE Optoelectronics Technology Co., Ltd., Anhui (CN); BOE Technology Group Co., Ltd., Beijing (CN)

(72) Inventors: Dong Wang, Beijing (CN); Hongmin Li, Beijing (CN); Liqing Liao, Beijing (CN)

(73) Assignees: Hefei BOE Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 302 days.

(21) Appl. No.: 17/775,430

(22) PCT Filed: May 25, 2021

(86) PCT No.: PCT/CN2021/095818
§ 371 (c)(1),
(2) Date: May 9, 2022

(87) PCT Pub. No.: WO2021/249182
PCT Pub. Date: Dec. 16, 2021

(65) Prior Publication Data
US 2022/0382110 A1 Dec. 1, 2022

(30) Foreign Application Priority Data
Jun. 12, 2020 (CN) .......................... 202010534674.5

(51) Int. Cl.
G02F 1/1362 (2006.01)
G02F 1/1343 (2006.01)
(Continued)

(52) U.S. Cl.
CPC .. G02F 1/134309 (2013.01); G02F 1/136295 (2021.01); H01L 27/124 (2013.01);
(Continued)

(58) Field of Classification Search
CPC ............. G02F 1/1333; G02F 1/133553; G02F 1/1343; G02F 1/134309; G02F 1/13439;
(Continued)

(56) References Cited

U.S. PATENT DOCUMENTS

2004/0021816 A1 2/2004 Jeong et al.
2005/0046764 A1* 3/2005 Enda ................. G02F 1/136286
349/43
(Continued)

FOREIGN PATENT DOCUMENTS

CN 1591151 A 3/2005
CN 1652002 A 8/2005
(Continued)

OTHER PUBLICATIONS

CN2020105346745 first office action.
(Continued)

*Primary Examiner* — Thoi V Duong
(74) *Attorney, Agent, or Firm* — IPro, PLLC

(57) ABSTRACT

A display substrate is provided, including: a base (1); and a plurality of pixel units (10) located on the base (1) and arranged in an array, where the display substrate further includes a plurality of data lines (25), and for each of the plurality of data lines (25), the data line (25) extends along a column direction and is located between adjacent first pixel unit (10A) and second pixel unit (10B) in a row direction, the data line (25) is arranged in a different layer from a first pixel electrode (40A) of the first pixel unit (10A) and a second pixel electrode (40B) of the second pixel unit (10B), and the data line (25) includes a first branch line (252)
(Continued)

and a second branch line (253) that are connected in parallel and extend in the column direction; an orthographic projection of the first branch line (252) on the base (1) at least partially overlaps with an orthographic projection of the first pixel electrode (40A) on the base (1); an orthographic projection of the second branch line (253) on the base (1) at least partially overlaps with an orthographic projection of the second pixel electrode (40B) on the base (1). A display panel and a method of manufacturing a display substrate are further provided.

18 Claims, 8 Drawing Sheets

(51) Int. Cl.
  *G02F 1/1368* (2006.01)
  *H01L 27/12* (2006.01)
(52) U.S. Cl.
  CPC ...... *H01L 27/1255* (2013.01); *H01L 27/1259* (2013.01); *G02F 1/13439* (2013.01); *G02F 1/136213* (2013.01); *G02F 1/136286* (2013.01); *G02F 1/1368* (2013.01)
(58) Field of Classification Search
  CPC .. G02F 1/1352; G02F 1/13606; G02F 1/1362; G02F 1/136213; G02F 1/136227; G02F 1/136286; G02F 1/13629; G02F 1/136295; G02F 1/1368; G02F 1/141; G02F 2203/09; G02F 2203/30; G09G 3/36; G09G 3/3614; H01L 27/124; H01L 27/1255; H01L 27/1259
  See application file for complete search history.

(56) References Cited

U.S. PATENT DOCUMENTS

| | | |
|---|---|---|
| 2005/0174503 A1 | 8/2005 | Kim et al. |
| 2007/0170504 A1 | 7/2007 | Chang |
| 2007/0236414 A1 | 10/2007 | Lin |
| 2009/0296010 A1 | 12/2009 | Kim et al. |
| 2010/0002159 A1 | 1/2010 | Hsiao et al. |
| 2010/0012939 A1 | 1/2010 | Ishii |
| 2012/0194414 A1 | 8/2012 | Lee et al. |
| 2018/0095334 A1 | 4/2018 | Zang et al. |
| 2018/0314124 A1 | 11/2018 | Dong et al. |
| 2019/0019815 A1 | 1/2019 | Wang et al. |
| 2021/0173271 A1 | 6/2021 | Long et al. |

FOREIGN PATENT DOCUMENTS

| | | |
|---|---|---|
| CN | 101520583 A | 9/2009 |
| CN | 101630685 A | 1/2010 |
| CN | 105572996 A | 5/2016 |
| CN | 105652543 A | 6/2016 |
| CN | 106886112 A | 6/2017 |
| CN | 107272292 A | 10/2017 |
| JP | H10253988 A | 9/1998 |
| JP | 2001290172 A | 10/2001 |
| KR | 20070028138 A | 3/2007 |
| KR | 20070074344 A | 7/2007 |
| KR | 20090123247 A | 12/2009 |

OTHER PUBLICATIONS

CN2020105346745 Decision of Rejection.
PCT/CN2021/095818 international search report.
PCT/CN2021/095818 Written Opinion.

* cited by examiner (N-1)ᵗʰ frame          Nᵗʰ frame
FIG. 2
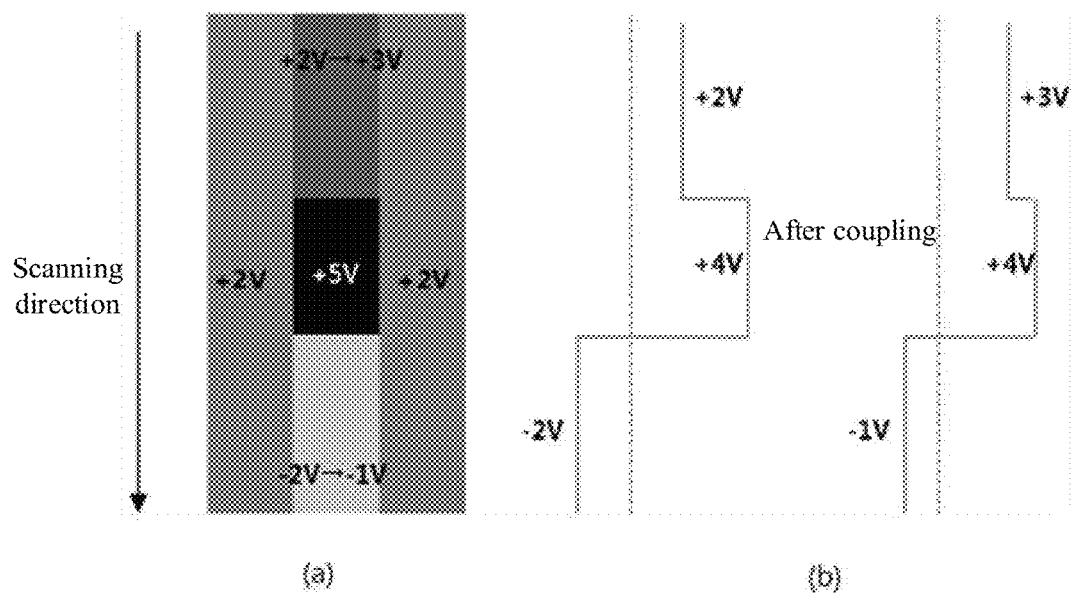
FIG. 3
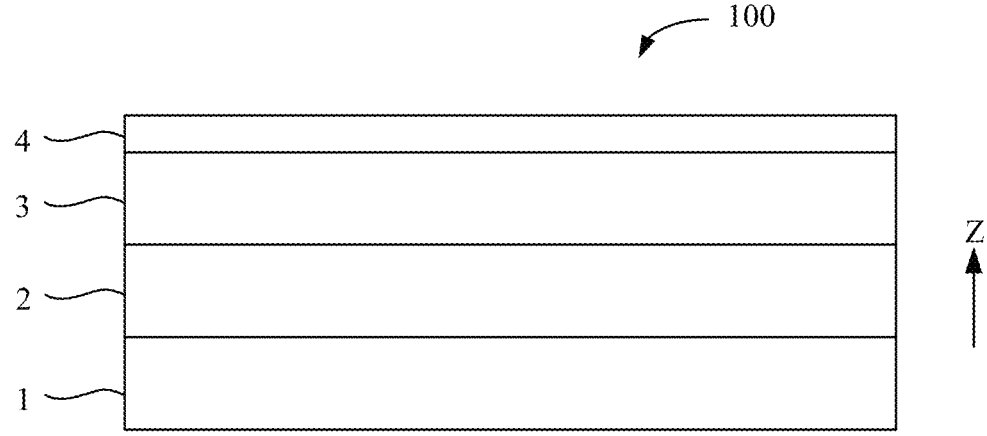
FIG. 4

DISPLAY SUBSTRATES, DISPLAY PANELS AND METHODS OF MANUFACTURING DISPLAY SUBSTRATE

CROSS-REFERENCE TO RELATED APPLICATIONS

This application is a national stage of international PCT Application No. PCT/CN2021/095818 filed on May 25, 2021, the entire contents of which are incorporated herein by reference.

This disclosure claims priority to Chinese patent application No. 202010534674.5 entitled "DISPLAY SUBSTRATES, DISPLAY PANELS AND METHODS OF MANUFACTURING DISPLAY SUBSTRATE", filed with the Chinese Patent Office on Jun. 12, 2020, the entire contents of which are incorporated herein by reference.

TECHNICAL FIELD

Examples of the present disclosure relate to display substrates, display panels and methods of manufacturing display substrate.

BACKGROUND

In the field of display, taking liquid crystal display as an example, the brightness of a display panel in different grayscales is realized by applying different voltages between pixel electrodes of an array substrate and common electrodes of a counter substrate. Specifically, signals of data lines are stored on the pixel electrodes through thin film transistors (TFTs), and if voltages on the data lines are different, voltages on the pixel electrodes are different, so that voltage differences between the pixel electrodes and the common electrodes of the counter substrate are different, and further liquid crystals are driven to deflect with different amplitudes to achieve a display of a picture in different grayscales.

SUMMARY

At least one example of the present disclosure provides a display substrate, including: a base; and a plurality of pixel units located on the base and arranged in an array, wherein the display substrate further includes a plurality of data lines, and for each of the plurality of data lines, the data line extends along a column direction and is located between adjacent first pixel unit and second pixel unit in a row direction, the data line is arranged in a different layer from a first pixel electrode of the first pixel unit and a second pixel electrode of the second pixel unit, and the data line includes a first branch line and a second branch line that are connected in parallel and extend in the column direction; an orthographic projection of the first branch line on the base at least partially overlaps with an orthographic projection of the first pixel electrode on the base; and an orthographic projection of the second branch line on the base at least partially overlaps with an orthographic projection of the second pixel electrode on the base.

In an example of the present disclosure, polarities of voltages applied to two adjacent data lines of the plurality of data lines are opposite.

In an example of the present disclosure, the data line further includes a trunk line, a first bridge portion, and a second bridge portion; the first bridge portion connects the first branch line and the trunk line, and the second bridge portion connects the second branch line and the trunk line.

In an example of the present disclosure, the first bridge portion is perpendicular to the trunk line, and the second bridge portion is perpendicular to the trunk line; or the first bridge portion is arranged at an obtuse angle to the trunk line, and the second bridge portion is arranged at an obtuse angle to the trunk line.

In an example of the present disclosure, the data line further includes a trunk line connected with the first branch line and the second branch line, and a sum of widths of the first branch line and the second branch line is not less than a width of the trunk line.

In an example of the present disclosure, the first branch line has a first side edge facing the second branch line; the second branch line has a second side edge facing the first branch line; the first pixel electrode has a third side edge facing the second pixel electrode; the second pixel electrode has a fourth side edge facing the first pixel electrode; and the first side edge, the third side edge, the fourth side edge and the second side edge are arranged sequentially along the row direction.

In an example of the present disclosure, a distance between the first side edge and the third side edge in the row direction is equal to a distance between the second side edge and the fourth side edge in the row direction.

In an example of the present disclosure, the distance between the first side edge and the third side edge in the row direction is not less than 2.5 µm, and the distance between the second side edge and the fourth side edge in the row direction is not less than 2.5 µm.

In an example of the present disclosure, the display substrate further includes storage electrodes and thin film transistors, wherein the storage electrodes and gate electrodes of the thin film transistors are arranged in a same layer, respective drain electrodes of the thin film transistors are electrically connected with the respective pixel electrodes, and the respective storage electrodes and the respective drain electrodes of the thin film transistors form storage capacitors.

In an example of the present disclosure, a ratio of an area of a drain electrode to an area of a corresponding pixel electrode is greater than or equal to 0.1 and less than 1.

In an example of the present disclosure, a distance between the first branch line and a storage electrode in the row direction is not less than 2.5 µm, and a distance between the second branch line and a storage electrode in the row direction is not less than 2.5 µm.

In an example of the present disclosure, the pixel electrodes are reflective electrodes, and the pixel electrodes have reflective surfaces facing away from the base.

In an example of the present disclosure, a distance between two pixel electrodes arranged adjacently along the row direction is 3 µm-5 µm.

In an example of the present disclosure, the data line is made of a reflective metal material.

At least one example of the present disclosure provides a display panel, including the display substrate as described above.

In an example of the present disclosure, the display panel is one of a reflective liquid crystal panel, a transflective liquid crystal panel, or a transmissive liquid crystal panel.

At least one example of the present disclosure provides a method of manufacturing a display substrate, including: providing a base; forming a plurality of pixel units and a plurality of data lines on the base, wherein the plurality of pixel units are arranged in an array, and each of the pixel units includes a pixel electrode; and forming a data line between two adjacent pixel units in a row direction, wherein the data line and the pixel electrodes of the pixel units are arranged in different layers, wherein the data line extends along a column direction and is located between a first pixel unit and a second pixel unit that are adjacent in the row direction, the data line is arranged in a different layer from a first pixel electrode of the first pixel unit and a second pixel electrode of the second pixel unit, and the data line includes a first branch line and a second branch line that are connected in parallel and extend in the column direction; an orthographic projection of the first branch line on the base at least partially overlaps with an orthographic projection of the first pixel electrode on the base; and an orthographic projection of the second branch line on the base at least partially overlaps with an orthographic projection of the second pixel electrode on the base.

By arranging data lines and pixel electrodes in different layers, and making a first branch line and a second branch line of each of the data lines respectively partially overlap with two adjacent pixel electrodes in a vertical direction, capacitances of parasitic capacitors formed between the data lines and the pixel electrodes can be reduced, eliminated or alleviated, and an effect of the parasitic capacitances on voltage differences between the pixel electrodes and common electrodes can be avoided or reduced, thereby improving a display effect.

BRIEF DESCRIPTION OF THE DRAWINGS

FIG. 2 is a schematic diagram of $(N-1)^{th}$ frame signal and $N^{th}$ frame signal when column inversion driving is adopted.

FIG. 3 is a principle diagram of generation of crosstalk on the display substrate shown in FIG. 1.

FIG. 4 is a schematic side view showing a display substrate according to an example of the present disclosure.

DETAILED DESCRIPTION OF THE EMBODIMENTS

Figure 1:
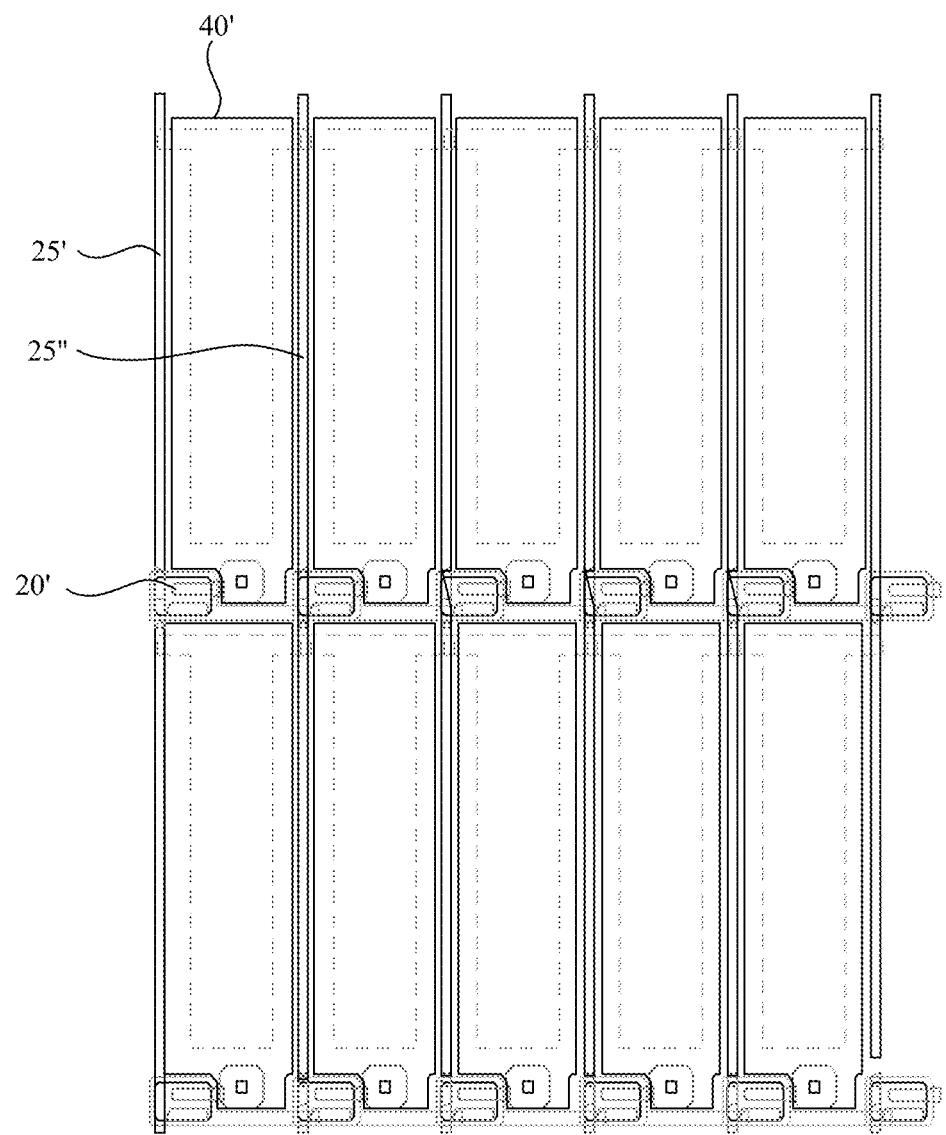
FIG. 1 is a schematic top view of a display substrate, where an insulation film layer is not shown.

Exemplary embodiments will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses consistent with some aspects of the present disclosure as detailed in the appended claims.

The terms used in the present disclosure are for the purpose of describing particular embodiments only, and are not intended to limit the present disclosure. Unless otherwise defined, technical or scientific terms used in this disclosure should have ordinary meaning as understood by one of ordinary skill in the art to which the disclosure belongs. "First", "second" and similar words used in the specification and claims of the present disclosure do not represent any order, quantity or importance, but are used only to distinguish different components. Likewise, words such as "one", "a" or "an" do not represent a quantity limit, but represent that there is at least one. "Plurality", "multiple" or "several" means two or more. Unless otherwise indicated, words such as "front", "rear", "lower" and/or "upper" are only for convenience of description, and are not limited to one position or one spatial orientation. Words such as "including" or "comprising" mean that an element or an item appearing before "including" or "comprising" covers elements or items and their equivalents listed after "including" or "comprising", without excluding other elements or items. Words such as "connect" or "connected with each other" are not limited to physical or mechanical connections, and may include electrical connections, whether direct or indirect. Terms determined by "a/an", "the" and "said" in their singular forms in the present disclosure and the appended claims are also intended to include plural forms unless clearly indicated otherwise in the context. It should also be understood that the term "and/or" as used herein refers to and includes any or all possible combinations of one or more associated listed items.

Referring to FIG. 1, a pixel electrode 40' receives signals of a drive chip through a thin film transistor 20' and a data line 25'. The pixel electrode 40' and the data line 25' on the left form a first parasitic capacitor $Cpd_L$, and the pixel electrode 40' and a data line 25" on the right form a second parasitic capacitor $Cpd_R$. For the reason of technologies, it is difficult to ensure that a lateral distance between the pixel electrode 40' and the data line 25' on the left is equal to a lateral distance between the pixel electrode 40' and the data line 25" on the right. And capacitance values are negatively related to distances ($C=\varepsilon S/(4\pi kd)$, where c represents a dielectric constant, S represents an overlapping/facing area of two plates facing each other, k represents an electrostatic force constant, and d represents a distance between the two plates). Unequal distances cause unequal capacitance values of the first parasitic capacitor $Cpd_L$ and the second parasitic capacitor $Cpd_R$. Taking driving in a column inversion manner as an example, voltage polarities of two adjacent data lines 25' and 25" are opposite, so that polarities of the first parasitic capacitor $Cpd_L$ and the second parasitic capacitor $Cpd_R$ are opposite, but the capacitance values of the first parasitic capacitor $Cpd_L$ and the second parasitic capacitor $Cpd_R$ are unequal, so that effects of the first parasitic capacitor $Cpd_L$ and the second parasitic capacitor $Cpd_R$ on the pixel electrode cannot be canceled out from each other. That is, an effect of a parasitic capacitor Cpd on the pixel electrode still exists. Moreover, a final polarity of the parasitic capacitor depends on which data line the pixel electrode is closer to. For example, if the distance between the pixel electrode 40' and the data line 25' on the left is closer, the capacitance value of the first parasitic capacitor $Cpd_L$ is larger, and the capacitance polarity of the parasitic capacitor Cpd is the same as that of the first parasitic capacitor $Cpd_L$.

Referring to FIG. 2 and FIG. 3(a), when pixel electrodes are driven in a column inversion manner, the pixel electrodes are scanned with signals in a direction from top to bottom (as shown by an arrow). At current moment, the scanning with a previous frame signal (negative frame signal) has been completed, and the scanning with a positive frame signal is being performed to a black picture (+5V region), where a voltage of an upper part of a pixel electrode remains +2V (the scanning with the positive frame signal has been completed), a voltage of a lower part of the pixel electrode remains −2V (the scanning with the positive frame signal has not been performed). A pixel voltage of middle region of L0 grayscale is +5V, and pixel voltages of surrounding region of L127 grayscale are +2V.

Referring to FIG. 3(a) and FIG. 3(b), when at the above moment, the middle region displays at L0 grayscale, and a voltage of an entire data line is +5V (a voltage of common electrodes is 0V). Due to the existence of the parasitic capacitor Cpd, at this time, a voltage of pixel electrodes in an upper part of a display substrate is pulled from +2V towards +5V, for example, the voltage is pulled to +3V, and a voltage difference between the pixel electrodes and the common electrodes is +3V (the picture becomes black relative to L127). A voltage of pixel electrodes in a lower part of the display substrate is pulled from −2V towards +5V, for example, the voltage is pulled to −1V, and then the voltage difference between the pixel electrodes and the common electrodes is −1V (the picture becomes bright relative to L127). When there is a difference between a middle pattern and a surrounding pattern, a data signal of the middle pattern pulls the pixel voltages at holding stages in higher and lower regions. Since the voltages of the pixel electrodes in the upper and lower parts of picture are pulled to different voltages, the voltage differences between the pixel electrodes in the upper and lower parts and the common electrodes change, and the changes cannot be canceled out, resulting in occurrence of crosstalk in a vertical direction.

At least one example of the present disclosure provides a display substrate. The display substrate includes a base and a plurality of pixel units located on the base. The plurality of pixel units are arranged in multiple rows and multiple columns, and each of the pixel units includes a pixel electrode. A data line is arranged between two adjacent pixel units in the same row, and the data line is arranged in a different layer from the pixel electrode of the pixel unit. The data line includes a first branch line and a second branch line that are connected with each other. An orthographic projection of the first branch line on the base partially overlaps with an orthographic projection of a pixel electrode of one of two adjacent pixel units on the base. An orthographic projection of the second branch line on the base partially overlaps with an orthographic projection of a pixel electrode of the other of the two adjacent pixel units on the base.

Figure 5:
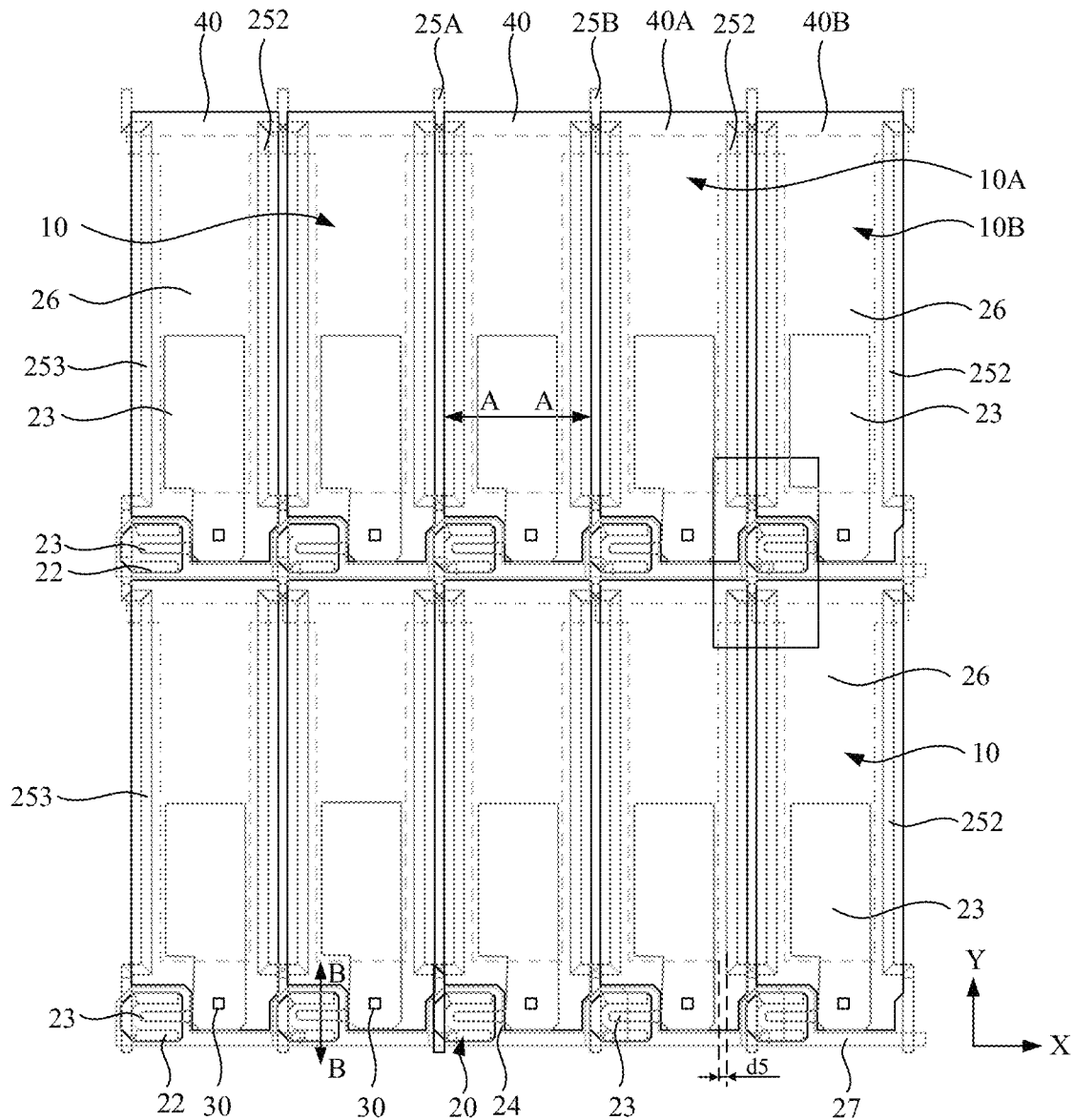
FIG. 5 is a schematic top view of the display substrate shown in FIG. 1, where structures such as a base, an organic insulation layer, and an inorganic insulation layer are not shown.

Referring to FIG. 4 and FIG. 5, a display substrate according to an example of the present disclosure, for example, an array substrate, includes a base 1, and a thin film transistor layer 2, an inorganic insulation layer 3 and a pixel electrode layer 4 arranged sequentially in a direction perpendicular to the base 1. A direction Z shown in FIG. 4 is the direction perpendicular to the base 1. In other embodiments, the inorganic insulation layer 3 can be replaced with other types of insulation layers, for example, a composite layer or a stacked layer of organic insulation materials and inorganic insulation materials, as long as they can play the role of electrical isolation. The thin film transistor layer 2 includes a plurality of thin film transistors 20. The pixel electrode layer 4 includes a plurality of pixel electrodes 40.

Figure 11:
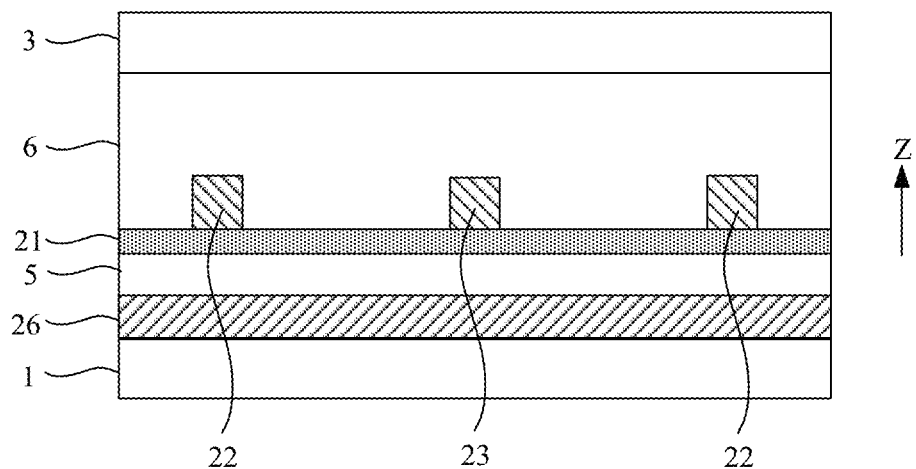
FIG. 11 is a schematic cross-sectional view taken along a line B-B in FIG. 5.

In this example, each of the thin film transistors 20 includes an active layer 21 (see FIG. 11), a source electrode 22, a drain electrode 23 and a gate electrode 24, and the thin film transistor layer 2 can be understood as a combination of these film layers. The source electrodes 22 and the drain electrodes 23 are arranged in the same layer, and gate electrodes 24 of thin film transistors in the same row are electrically connected through a scan line 27. The display substrate further includes a gate insulation layer 5 (see FIG. 11), an organic insulation layer 6 (see FIG. 11), a plurality of data lines 25, and a plurality of storage electrodes 26. The gate electrodes 24, the gate insulation layer 5, the active layer 21, the source electrodes 22 (or the drain electrodes 23 and the data lines 25), the organic insulation layer 6, the inorganic insulation layer 3, and the pixel electrode layer 4 are arranged sequentially along the direction Z. In this example, the data lines 25 are arranged in the same layer as the source electrodes 22 and the drain electrodes 23, and the storage electrodes 26 are arranged in the same layer as the gate electrodes 24. The arrangement in the same layer can be understood as formation in the same patterning process, which is beneficial to simplify the manufacturing process of the display substrate. In other embodiments of the present disclosure, the data lines 25 and the storage electrodes 26 may be arranged in other film layers. The storage electrodes 26 are configured to form storage capacitors with the drain electrodes 23, and the drain electrodes 23 are electrically connected with the pixel electrodes 40 of the pixel electrode layer 4, so that potentials of the drain electrodes 23 and the pixel electrodes 40 are equal. That is, storage capacitors are formed between the storage electrodes 26 and the pixel electrodes 40. The storage capacitors are configured to store an amount of electricity, so that the picture can still be maintained for a period of time after a voltage of the data lines disappears. The storage electrodes are further configured to provide a common signal (or a ground signal) for common electrodes on a counter substrate, and the storage electrodes and the common electrodes can be electrically connected by conductive support posts or conductive adhesives supported between the display substrate and the counter substrate. In this example, the storage electrodes 26 are integral (to clearly illustrate different pixel units, the storage electrode 26 is shown with a dividing line between adjacent pixel units 10, which does not exist actually) and are grounded. In other embodiments of the present disclosure, the display substrate is provided with a plurality of storage electrodes 26 which are respectively grounded.

The display substrate according to the example of the present disclosure is suitable for liquid crystal display. An electric field formed after the pixel electrodes and the common electrodes on the counter substrate are applied with a voltage may drive liquid crystals to deflect for display. The pixel electrodes are electrically connected with the drain electrodes 23 of the thin film transistors 20, and the data lines 25 are electrically connected with the source electrodes 22 of the thin film transistors 20, so that the pixel electrodes can receive drive signals of a drive chip (not shown) through the data lines 25 and the thin film transistors 20.

In an example of the present disclosure, the display substrate is suitable for reflective liquid crystal panels. The drain electrodes 23 are arranged below reflective electrodes (i.e., the pixel electrodes), so that the drain electrodes 23 will not affect light output. Therefore, an area of the drain electrode 23 can be designed to be larger, for example, not less than 1/10 of an area of the pixel unit (also understood as an area of the pixel electrode). Capacitance of the storage capacitor formed between the drain electrode 23 and the storage electrode 26 can be increased by increasing the area of the drain electrode 23, so that a currently displayed picture can be better maintained until a next picture after a drive voltage disappears. Theoretically, the area of the drain electrode can be infinitely close to the area of the pixel unit. That is, a ratio of the area of the drain electrode to the area of the pixel unit is close to 1. However, in practice, the influence of the area of the drain electrode on other electrical parameters needs to be considered.

Figure 6:
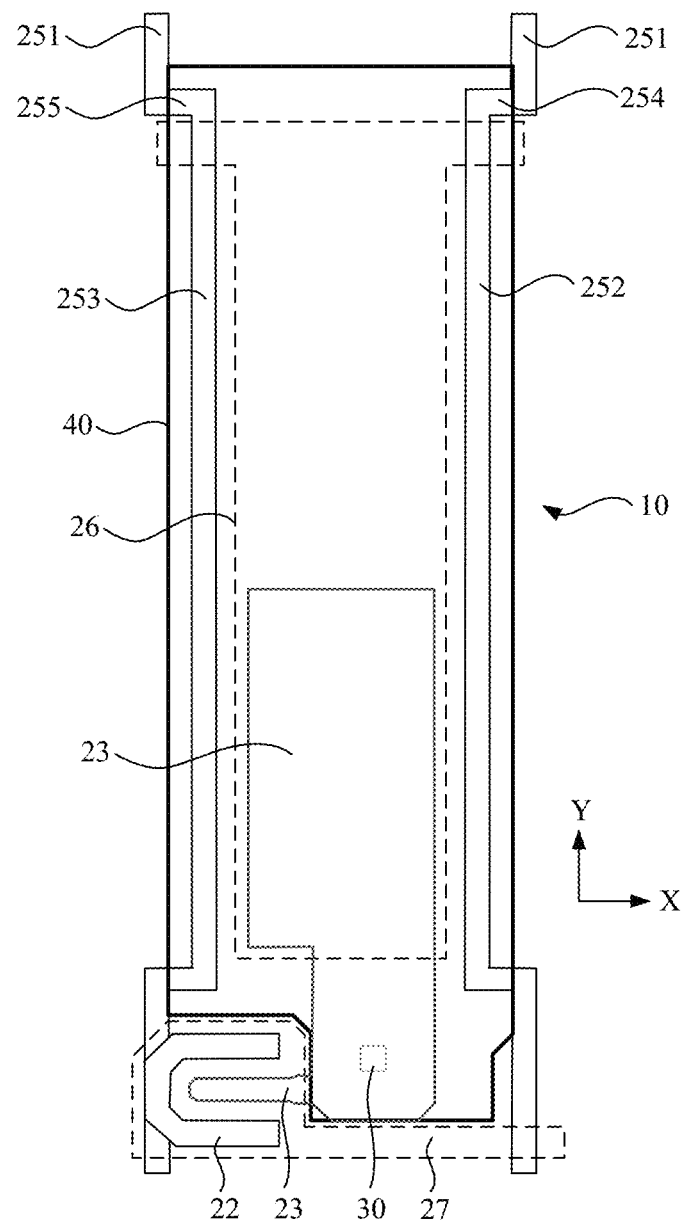
FIG. 6 is a schematic top view of one pixel unit of the display substrate shown in FIG. 5.
Figure 7:
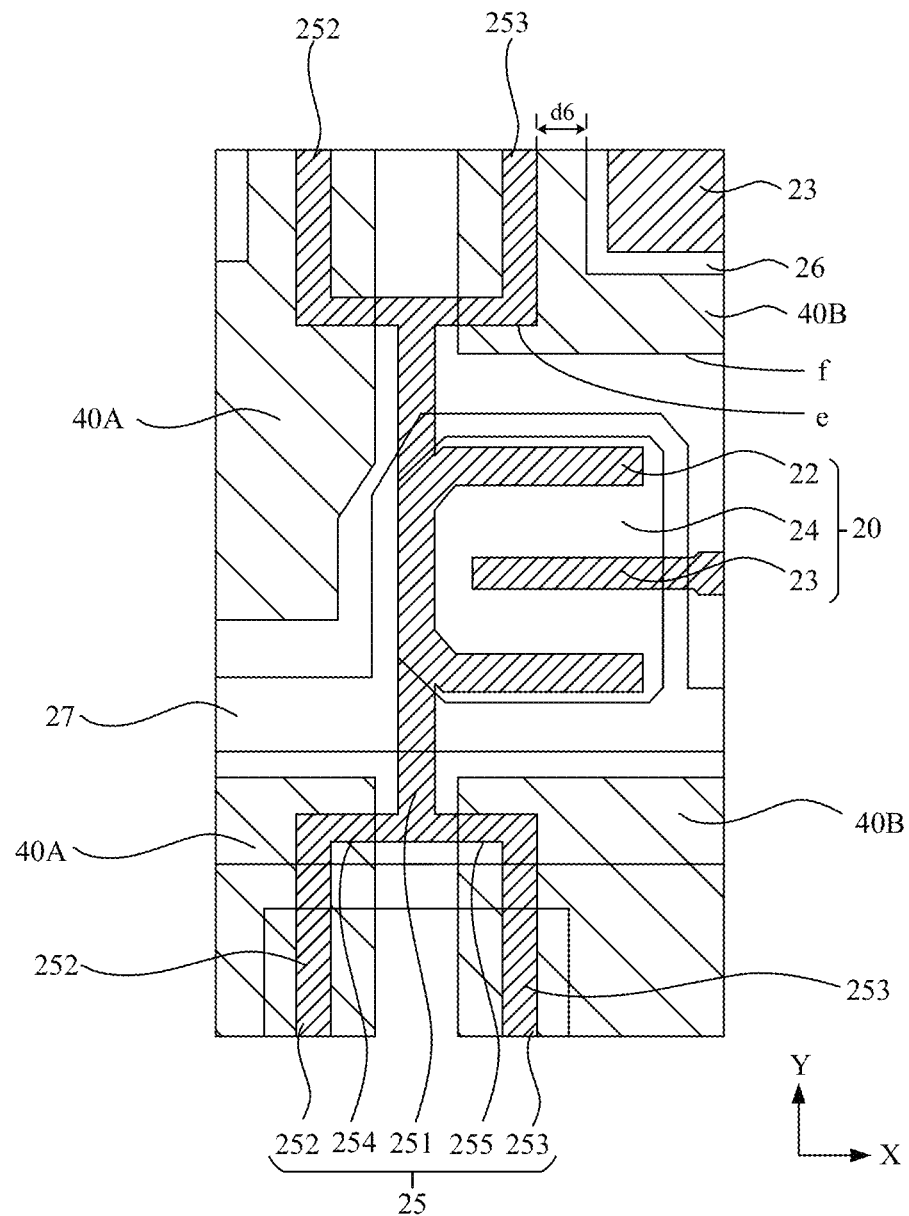
FIG. 7 is a partial enlarged view of FIG. 5, where, for ease of understanding, illustrations of a thin film transistor, an electrode group, and a data line are filled with patterns.

Referring to FIGS. 5-7, the display substrate includes a plurality of pixel units 10 arranged in an array, and each of the pixel units 10 includes a pixel electrode 40. Each of the pixel electrodes 40 is connected with a corresponding thin film transistor 20. In an example, the pixel unit 10 may further include other insulation film layers, such as the inorganic insulation layer 3. Each of the data lines 25 is arranged between two adjacent pixel units 10 along a row direction X. Here, the "arranged between" can be understood as being partly or completely arranged. Further, a projection of the data line 25 on the base 1 being partially located between projections of two pixel units 10 on the base suffices.

The data line 25 includes a trunk line 251, a first branch line 252, a second branch line 253, a first bridge portion 254, and a second bridge portion 255. The first bridge portion 254 connects the trunk line 251 and the first branch line 252. The second bridge portion 255 connects the trunk line 251 and the second branch line 253. That is, the first branch line 252 is connected in series with the first bridge portion 254, and the second branch line 253 is connected in series with the second bridge portion 255, then the two series circuits are connected in parallel. The trunk line 251, the first branch line 252, the second branch line 253, the first bridge portion 254, and the second bridge portion 255 form a data line unit. The data lines 25 can be regarded as being composed of a plurality of data line units connected end to end and arranged along the row direction X. Each data line unit corresponds to (is connected with) one thin film transistor 20.

Referring to FIGS. 5-7, for two adjacent pixel units 10A and 10B in the row direction (corresponding pixel electrodes 40A and 40B are also adjacent), an orthographic projection of the first branch line 252 of the data line 25 on the base 1 at least partially overlaps with an orthographic projection of the pixel electrode 40A of the pixel unit 10A on the base 1, and an orthographic projection of the second branch line 253 of the data line 25 on the base 1 at least partially overlaps with an orthographic projection of the pixel electrode 40B of the pixel unit 10B on the base 1.

The pixel electrode 40 and a data line 25A on the left form a first parasitic capacitor $Cpd_L$, and the pixel electrode 40 and a data line 25B on the right form a second parasitic capacitor $Cpd_R$. Since the data lines 25A, 25B and the pixel electrode 40 are located in different layers, and the orthographic projections of the data lines 25A, 25B at least partially overlap with the orthographic projection of the pixel electrode 40, respectively, theoretically, capacitances of the first parasitic capacitor $Cpd_L$ and the second parasitic capacitor $Cpd_R$ are irrelevant (or almost irrelevant) to distances between the data lines 25A, 25B and the pixel electrode 40 in the row direction X. That is, distances between the data lines 25A, 25B and the pixel electrode 40 in the vertical direction Z mainly affect capacitances of the first parasitic capacitor $Cpd_L$ and the second parasitic capacitor $Cpd_R$. Even if deviations in distances in the row direction are caused by technology problems, capacitances of the parasitic capacitors may not be affected. That is, whether there are deviations in capacitances of the parasitic capacitors formed between the two data lines and the pixel electrode is related only to the distances between the two data lines and the pixel electrode in the vertical direction Z. In terms of technologies, it is easy to control spacing in the vertical direction Z. As long as thicknesses of film layers between the pixel electrode and the data lines are uniform, capacitance values of the first parasitic capacitor $Cpd_L$ and the second parasitic capacitor $Cpd_R$ can be ensured to be equal. Of course, the premise is to ensure that other parameters corresponding to the $Cpd_L$ and the $Cpd_R$ are consistent, such as the same material and equal facing area.

In some examples of the present disclosure, polarities of voltages of two adjacent data lines are opposite, so that polarities of the first parasitic capacitor $Cpd_L$ and the second parasitic capacitor $Cpd_R$ are opposite, but their capacitance values are equal, so that effects of the $Cpd_L$ and the $Cpd_R$ on the pixel electrode can be canceled out from each other (or pulls of the data lines on a voltage of the pixel electrode are canceled out from each other). In this way, effects of the data lines on the voltage of the pixel electrode can be eliminated, and a voltage difference between the pixel electrode and a common electrode on a counter substrate remains unchanged to ensure that a picture grayscale is not affected by the parasitic capacitances, thereby alleviating crosstalk in the vertical direction.

In some examples of the present disclosure, the trunk line 251 is vertical to the first bridge portion 254, and the trunk line 251 is vertical to the second bridge portion 255, so that the trunk line 251, the first bridge portion 254, and the second bridge portion 255 have a "T" shape as a whole. It should be noted that, for the reason of technologies, there may be a certain deviation in the "verticalness", for example, a connection portion between the trunk line 251 and the first bridge portion 254 (or the second bridge portion 255) is arc-shaped or has other curved shapes; or, for the reason of technologies, there may be a certain deviation in an angle between the trunk line 251 and the first bridge portion 254 (or the second bridge portion 255), for example, the angle may be 85°-95°. It is verified by experiments that, using the data line structure according to the above embodiments, signal crosstalk in the vertical direction can be reduced to 0, i.e., LV0, thereby avoiding the influence on the voltage difference between the pixel electrodes and the common electrodes, which is beneficial to improve the display effect.

Figure 8:
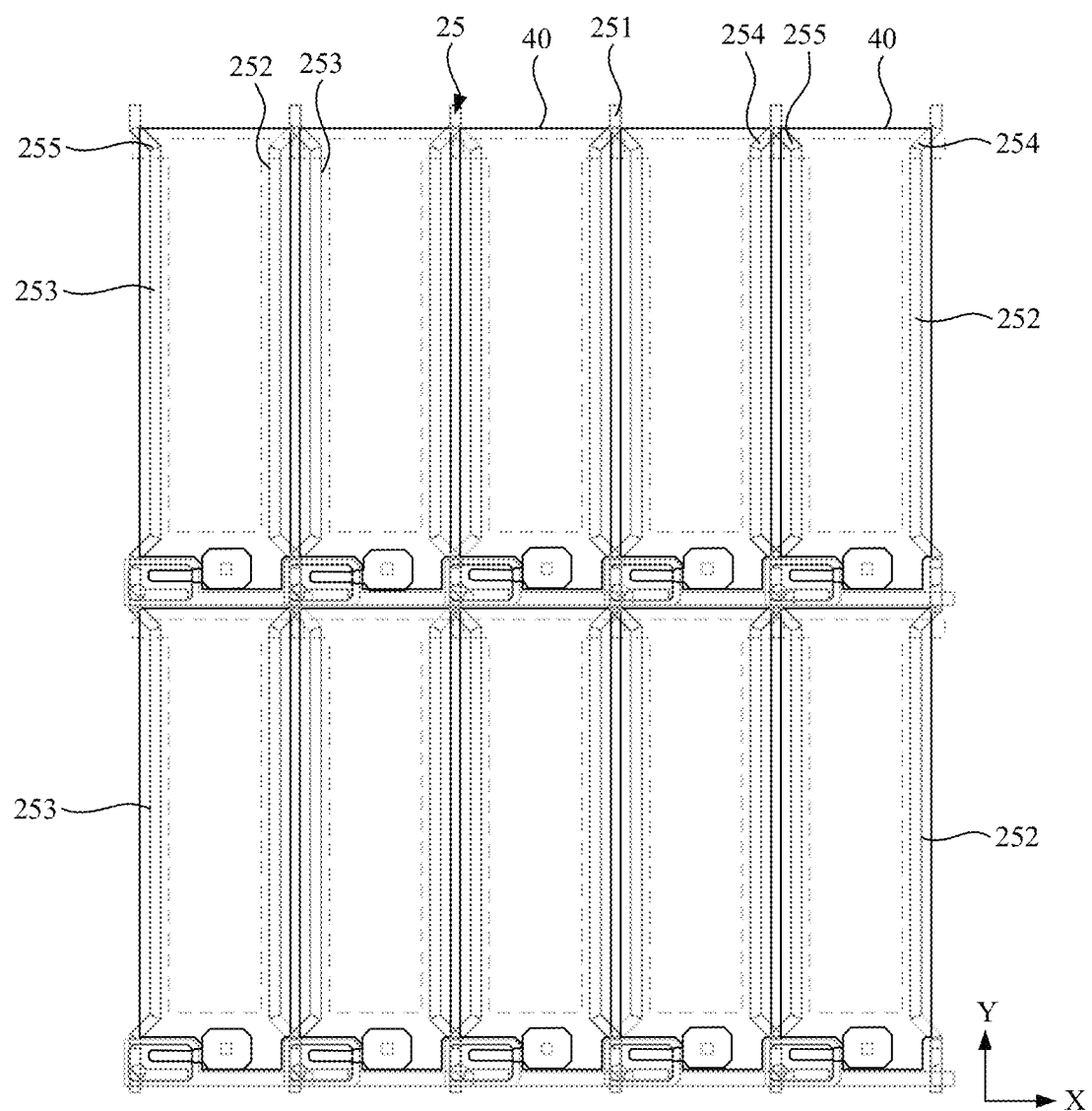
FIG. 8 is a schematic top view showing a display panel according to another example of the present disclosure, where structures such as a base, an organic insulation layer, and an inorganic insulation layer are not shown.

In some examples of the present disclosure, the data line 25 may have other configurations. Referring to FIG. 8, the angles between the trunk line 251 of the data line 25 and the first bridge portion 254 and the second bridge portion 255 may also be other angles, for example, obtuse angles, and remaining structures are similar to that in the embodiments shown in FIG. 5. Similarly, the transition between the trunk line 251 and the first bridge portion 254 (or the second bridge portion 255) can be made by a curve, such as a circular arc. In some examples of the present disclosure, in the case where the first bridge portion 254 and the second bridge portion 255 are drawn from the trunk line 251 at the same position, both a total length of a series circuit of the first bridge portion 254 and the first branch line 252 and a total length of a series circuit of the second bridge portion 255 and the second branch line 253 are smaller than a length of corresponding series circuit in the above embodiments, which is beneficial to further reduce the impedance of the data line, thereby facilitating the driving to the pixel electrode.

Figure 9:
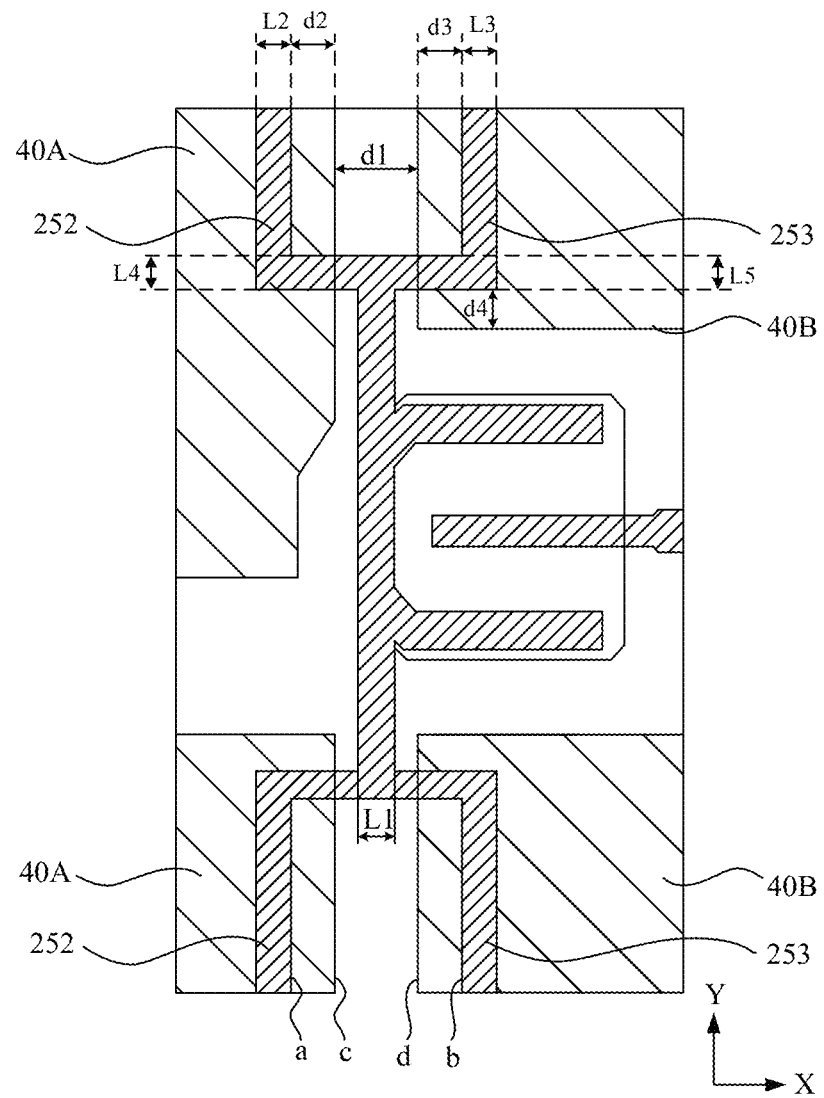
FIG. 9 is a partial enlarged view of FIG. 5, where, for ease of understanding, only structures such as a thin film transistor, an electrode group, and a data line are shown, and illustrations of the thin film transistor, the electrode group, and the data line are filled with patterns.

Continuing to refer to FIGS. 7-9, in some examples of the present disclosure, a width L1 of the trunk line 251 is 3 um (the width of a region connected with the source electrode of the thin film transistor is slightly larger, which is not shown in the drawings), and a width L2 of the first branch line 252, a width L3 of the second branch line 253, a width L4 of the first bridge portion 254, and a width L5 of the second bridge portion 255 are 3 μm. Non-trunk line segments of the data lines 25 (first branch lines 252, second branch lines 253, first bridge portions 254, and second bridge portions 255) are parallel circuits. Because thicknesses and materials in different regions of the data lines are same, an impedance of a unit length of a non-trunk line segment is only half of an impedance of a unit length of a trunk line segment, and the reduction of impedance facilitates the driving to the pixel electrode. In some examples of the present disclosure, as long as it is ensured that a sum of the widths of the first branch line 252 and the second branch line 253 (or a sum of the widths of the first bridge portion 254 and the second bridge portion 255) is greater than the width of the trunk line 251, the impedance can be reduced. The "width" here can be understood as a size in a direction perpendicular to an extension direction, and the direction perpendicular to the extension direction is an arrangement direction of the first branch lines 252 and the second branch lines 253, that is, the row direction X.

Figure 10:
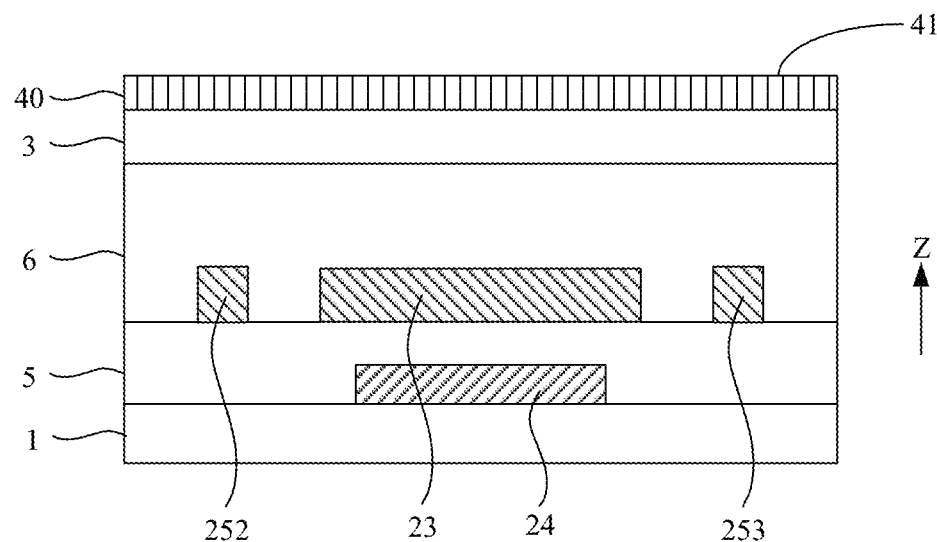
FIG. 10 is a schematic cross-sectional view taken along a line A-A in FIG. 5.

Since the data lines 25 are arranged directly below the pixel electrodes 40, and will not occupy the space between adjacent pixel electrodes 40, it is beneficial to increase the area of the pixel electrodes, and an area of liquid crystals that can be driven is increased, which is beneficial to improve the display effect. In some examples of the present disclosure, as shown in FIG. 10, the pixel electrodes 40 are reflective electrodes, and the pixel electrodes 40 have reflective surfaces 41 facing away from the base 1 for reflecting light in a direction away from the base 1, that is, the liquid crystal panel is a reflective liquid crystal panel. An area of the reflective surfaces 41 is determined based on the pixel electrodes 40, and thus is positively related to the area of the pixel electrodes 40. The area of the reflective surfaces 41 increases with the area of the pixel electrodes 40, which is beneficial to reflect more light, thereby increasing the brightness of the display panel, and improving the display effect. In addition, in the reflective liquid crystal display panel, the pixel electrodes do not need to transmit light, so that even if opaque metal data lines are selected and their branch lines are arranged directly below the pixel electrodes, a pixel aperture ratio may not be affected. In some examples of the present disclosure, the display panel may be a transflective liquid crystal panel or a transmissive liquid crystal panel including a backlight source.

Referring to FIGS. 6, 7 and 9, a distance d1 between two adjacent pixel electrodes is 3~5 μm. Within this distance range, a good display effect can be ensured, and requirements for manufacturing processes are lower. In some examples of the present disclosure, to ensure the good display effect and avoid color mixing between adjacent pixels due to too small pixel spacing, the distance d1 between two adjacent pixel electrodes is 4-5 μm. In some examples of the present disclosure, d1 is 5 μm. In other examples, the distance d1 between two adjacent pixel electrodes can be set to be less than 3 μm.

The first branch line 252 has a first side edge a facing the second branch line 253. The second branch line 253 has a second side edge b facing the first branch line 252. The pixel electrode 40A (whose projection partially overlaps with a projection of the first branch line 252) has a third side edge c facing the pixel electrode 40B (whose projection partially overlaps with a projection of the second branch line 253). The pixel electrode 40B has a fourth side edge d facing the pixel electrode 40A. The first bridge portion 254 has a fifth side edge e facing the thin film transistor 20. The pixel electrode 40B has a sixth side edge f facing the thin film transistor 20. The drain electrode of the thin film transistor 20 is electrically connected with the pixel electrode 40B. The first side edge a, the third side edge c, the fourth side edge d, and the second side edge b are arranged sequentially along the row direction X, and extend along the column direction Y. The fifth side edge e and the sixth side edge f extend in the row direction X. In other words, orthographic projections of the first branch line 252 and the second branch line 253 may not fall between two adjacent pixel electrodes in the row direction.

To completely cancel out capacitances of the first parasitic capacitor $Cpd_L$ and the second parasitic capacitor $Cpd_R$ and further alleviate the crosstalk in the vertical direction, a distance d2 between the first side edge a and the third side edge c is equal to a distance d3 between the second side edge b and the four side edge d. To further ensure that the capacitances of the first parasitic capacitor $Cpd_L$ and the second parasitic capacitor $Cpd_R$ can be completely canceled out from each other (that is, capacitance values are equal and polarities are opposite), and thus the crosstalk in the vertical direction can be eliminated, in some examples of the present disclosure, both d2 and d3 are not less than 2.5 μm. A distance d4 between the fifth side edge e and the sixth side edge f is not less than 2.5 μm. In this embodiment, d2=d3=d4=3.5 μm. Even if there is a slight position deviation for the data line 25 (or the first branch line 252 and the second branch line 253) in the row direction X, due to the existence of the distance d2 between the first side edge a and the third side edge c and the distance d3 between the second side edge b and the fourth side edge d, it can still be ensured that a facing area between the data line 25 and the pixel electrode 40 does not change, thereby ensuring that the capacitance values of $Cpd_L$ and $Cpd_R$ are equal, and avoiding the crosstalk.

Further, to avoid the first branch line 252 and the storage electrode 26 from generating a parasitic capacitor and the second branch line 253 and the storage electrode 26 from generating a parasitic capacitor, which further affects the potential of the pixel electrode to cause signal crosstalk, a lateral distance d5 (see FIG. 5 for reference numeral) between the first branch line 252 and its adjacent storage electrode 26 (that is, the storage electrode on the left of the first branch line 252, because a distance between the first branch line 252 and the storage electrode on the right of the first branch line 252 is larger) is not less than 2.5 μm, and a lateral distance d6 (see FIG. 7 for reference numeral) between the second branch line 253 and its adjacent storage electrode 26 is not less than 2.5 μm. In this embodiment, d5=d6=4 μm.

A method of manufacturing a display substrate will be briefly introduced below with reference to FIGS. 4, 5, 10 and 11.

A thin film transistor layer 2 is formed on a base 1. In some examples of the present disclosure, on the base 1 (or a buffer layer on the base 1), gate electrodes 24 and storage electrodes 26 are formed through the same patterning process; a gate insulation layer 5 is formed on the gate electrodes 24 and the storage electrodes 26; an active layer 21 is formed on the gate insulation layer 5; a source & drain electrode layer is formed on the active layer 21, and the source & drain electrode layer includes source electrodes 22, drain electrodes 23, and data lines 25 electrically connected with the source electrodes 22.

Then, an organic insulation layer 6 is formed on the thin film transistor layer 2; an inorganic insulation layer 3 is formed on the organic insulation layer 6; a pixel electrode layer 4 is formed on the inorganic insulation layer 3, where pixel electrodes 40 in the pixel electrode layer 4 are electrically connected with the drain electrodes 23 of thin film transistors through via holes 30 (see FIG. 5). The via holes 30 penetrate through the organic insulation layer 6 and the inorganic insulation layer 3.

In some examples of the present disclosure, the data line 25 may be made of reflective metal materials, such as silver.

In some examples of the present disclosure, the organic insulation layer 6 is made of organic materials, such as positive polymethyl methacrylate, negative polymethyl methacrylate, or other organic materials with larger dielectric constants, and the organic insulation layer 6 with a larger dielectric constant is used to reduce capacitances of the parasitic capacitors formed between the data lines 25 and the pixel electrodes 40. In some examples of the present disclosure, a thickness of the organic insulation layer 6 is 1-3 µm. With this thickness, the organic insulation layer can effectively reduce capacitances of the parasitic capacitors formed between the data lines and the pixel electrodes while having less influence on the overall thickness of the display substrate. The inorganic insulation layer 3 is configured to further reduce capacitances of the parasitic capacitors formed between the data lines and the pixel electrodes. In this case, the inorganic insulation layer 3 is further used as a planarization layer to provide a relatively flat surface for the pixel electrodes, which is beneficial to improve the film layer quality of the pixel electrodes.

Figure 12:
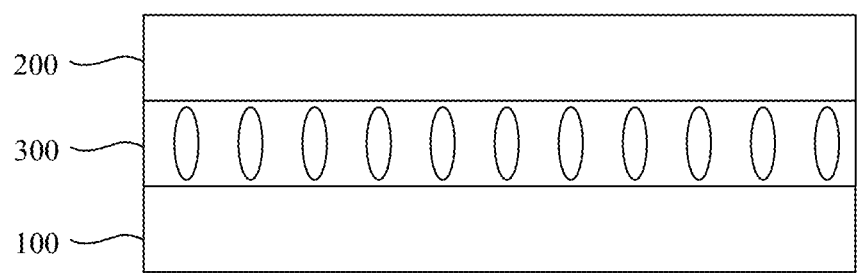
FIG. 12 is a schematic side view showing a display panel according to an example of the present disclosure.

At least one example of the present disclosure provides a display panel, which may be a reflective liquid crystal panel, a transflective liquid crystal panel, or a transmissive liquid crystal panel. Referring to FIG. 12, the display panel includes a counter substrate 200, a liquid crystal layer 300, and a display substrate 100 described in any of the above embodiments. The counter substrate 200 may be a color film substrate, which includes color filters (CFs), common electrodes, and other structures. The display panel may further include conductive support posts, which are arranged in the liquid crystal layer 300 and configured to support the counter substrate 200 and the display substrate 100, and the conductive support posts can electrically connect common electrodes and storage electrodes 26 (see FIGS. 5 and 6), thereby providing COM signals (usually ground signals) for the common electrodes.

At least one example of the present disclosure provides a display apparatus, which may be a mobile phone, a tablet computer, a display, a television, or other display devices. The display apparatus may include the above-mentioned display panel (reflective, transflective or transmissive liquid crystal display panel), and the display apparatus may further include structures such as a casing, a mainboard, a processor, a memory, and a communicator.

The above are only preferred embodiments of the present disclosure, which are not intended to make any formal limitation on the disclosure. Although the present disclosure has been disclosed as above in the preferred embodiments, these preferred embodiments are not intended to limit the present disclosure, and any person skilled in the art, without departing from the scope of the technical solutions of the present disclosure, can make some changes or modifications to the technical contents disclosed above as equivalent embodiments with equivalent changes. However, without departing from the contents of the technical solutions of the present disclosure, any simple revisions, equivalent changes and modifications made to the above embodiments based on the technical essence of the present disclosure still fall within the scope of the technical solutions of the present disclosure.

The invention claimed is:

1. A display substrate, comprising:
a base; and
a plurality of pixel units located on the base and arranged in an array,
wherein the display substrate further comprises a plurality of data lines, and for each of the plurality of data lines,
the data line extends along a column direction and is located between adjacent first pixel unit and second pixel unit in a row direction,
the data line is arranged in a different layer from a first pixel electrode of the first pixel unit and a second pixel electrode of the second pixel unit, and
the data line comprises a first branch line and a second branch line that are connected in parallel and extend in the column direction;
an orthographic projection of the first branch line on the base at least partially overlaps with an orthographic projection of the first pixel electrode on the base; and
an orthographic projection of the second branch line on the base at least partially overlaps with an orthographic projection of the second pixel electrode on the base;
wherein the display substrate further comprises storage electrodes and thin film transistors, wherein the storage electrodes and gate electrodes of the thin film transistors are arranged in a same layer, respective drain electrodes of the thin film transistors are connected with the respective pixel electrodes, and the respective storage electrodes and the respective drain electrodes of the thin film transistors form storage capacitors;
wherein a distance between the first branch line and a closest storage electrode in the row direction is not less than 2.5 µm, and a distance between the second branch line and a closest storage electrode in the row direction is not less than 2.5 µm.

2. The display substrate according to claim 1, wherein polarities of voltages applied to two adjacent data lines of the plurality of data lines are opposite.

3. The display substrate according to claim 1, wherein the data line further comprises a trunk line, a first bridge portion, and a second bridge portion; the first bridge portion connects the first branch line and the trunk line, and the second bridge portion connects the second branch line and the trunk line.

4. The display substrate according to claim 3, wherein the first bridge portion is perpendicular to the trunk line, and the second bridge portion is perpendicular to the trunk line; or the first bridge portion is arranged at an obtuse angle to the trunk line, and the second bridge portion is arranged at an obtuse angle to the trunk line.

5. The display substrate according to claim 1, wherein the data line further comprises a trunk line connected with the first branch line and the second branch line, and a sum of widths of the first branch line and the second branch line is not less than a width of the trunk line.

6. The display substrate according to claim 1, wherein the first branch line has a first side edge facing the second branch line;
the second branch line has a second side edge facing the first branch line;
the first pixel electrode has a third side edge facing the second pixel electrode;
the second pixel electrode has a fourth side edge facing the first pixel electrode; and
the first side edge, the third side edge, the fourth side edge and the second side edge are arranged sequentially along the row direction.

7. The display substrate according to claim 6, wherein a distance between the first side edge and the third side edge in the row direction is equal to a distance between the second side edge and the fourth side edge in the row direction.

8. The display substrate according to claim 7, wherein the distance between the first side edge and the third side edge in the row direction is not less than 2.5 µm, and the distance between the second side edge and the fourth side edge in the row direction is not less than 2.5 µm.

9. The display substrate according to claim 1, wherein a ratio of an area of a drain electrode to an area of a corresponding pixel electrode is greater than or equal to 0.1 and less than 1.

10. The display substrate according to claim 1, wherein the pixel electrodes are reflective electrodes, and the pixel electrodes have reflective surfaces facing away from the base.

11. The display substrate according to claim 1, wherein a distance between two pixel electrodes arranged adjacently along the row direction is 3 µm-5 µm.

12. The display substrate according to claim 1, wherein the data line is made of a reflective metal material.

13. A display panel, comprising a display substrate comprising:
a base; and
a plurality of pixel units located on the base and arranged in an array,
wherein the display substrate further comprises a plurality of data lines, and for each of the plurality of data lines,
the data line extends along a column direction and is located between adjacent first pixel unit and second pixel unit in a row direction,
the data line is arranged in a different layer from a first pixel electrode of the first pixel unit and a second pixel electrode of the second pixel unit, and
the data line comprises a first branch line and a second branch line that are connected in parallel and extend in the column direction;
an orthographic projection of the first branch line on the base at least partially overlaps with an orthographic projection of the first pixel electrode on the base; and
an orthographic projection of the second branch line on the base at least partially overlaps with an orthographic projection of the second pixel electrode on the base;
wherein the display substrate further comprises storage electrodes and thin film transistors, wherein the storage electrodes and gate electrodes of the thin film transistors are arranged in a same layer, respective drain electrodes of the thin film transistors are connected with the respective pixel electrodes, and the respective storage electrodes and the respective drain electrodes of the thin film transistors form storage capacitors;
wherein a distance between the first branch line and a closest storage electrode in the row direction is not less than 2.5 µm, and a distance between the second branch line and a closest storage electrode in the row direction is not less than 2.5 µm.

14. The display panel according to claim 13, wherein the display panel is one of a reflective liquid crystal panel, a transflective liquid crystal panel, or a transmissive liquid crystal panel.

15. The display panel according to claim 13, wherein polarities of voltages applied to two adjacent data lines of the plurality of data lines are opposite.

16. The display panel according to claim 13, wherein the data line further comprises a trunk line, a first bridge portion, and a second bridge portion; the first bridge portion connects the first branch line and the trunk line, and the second bridge portion connects the second branch line and the trunk line.

17. The display panel according to claim 16, wherein the first bridge portion is perpendicular to the trunk line, and the second bridge portion is perpendicular to the trunk line; or the first bridge portion is arranged at an obtuse angle to the trunk line, and the second bridge portion is arranged at an obtuse angle to the trunk line.

18. A method of manufacturing a display substrate, comprising:
providing a base;
forming a plurality of pixel units on the base, wherein the plurality of pixel units are arranged in an array, and each of the pixel units comprises a pixel electrode; and
forming a data line between two adjacent pixel units in a row direction, wherein the data line and the pixel electrodes of the pixel units are arranged in different layers,
wherein the data line extends along a column direction and is located between a first pixel unit and a second pixel unit that are adjacent in the row direction, the data line is arranged in a different layer from a first pixel electrode of the first pixel unit and a second pixel electrode of the second pixel unit, and the data line comprises a first branch line and a second branch line that are connected in parallel and extend in the column direction; an orthographic projection of the first branch line on the base at least partially overlaps with an orthographic projection of the first pixel electrode on the base; an orthographic projection of the second branch line on the base at least partially overlaps with an orthographic projection of the second pixel electrode on the base;
wherein the display substrate comprises storage electrodes and thin film transistors, wherein the storage electrodes and gate electrodes of the thin film transistors are arranged in a same layer, respective drain electrodes of the thin film transistors are connected with the respective pixel electrodes, and the respective storage electrodes and the respective drain electrodes of the thin film transistors form storage capacitors;
wherein a distance between the first branch line and a closest storage electrode in the row direction is not less than 2.5 µm, and a distance between the second branch line and a closest storage electrode in the row direction is not less than 2.5 µm.

* * * * *